United States Patent [19]
Mihara

[11] Patent Number: 5,329,112
[45] Date of Patent: Jul. 12, 1994

[54] MULTI-CAPACITANCE PHOTODIODE IMAGE SENSOR

[75] Inventor: Akira Mihara, Ebina, Japan

[73] Assignee: Fuji Xerox Co., Ltd., Tokyo, Japan

[21] Appl. No.: 977,171

[22] Filed: Nov. 16, 1992

[30] Foreign Application Priority Data

Dec. 6, 1991 [JP] Japan ................. 3-348511

[51] Int. Cl.⁵ ............................................. H01J 40/14
[52] U.S. Cl. ................................ 250/208.1; 257/435
[58] Field of Search ............... 250/208.1, 578.1, 214.1; 257/435, 436, 53, 59, 448, 449; 358/213.11, 213.13, 213.29, 213.27

[56] References Cited

U.S. PATENT DOCUMENTS

| | | | |
|---|---|---|---|
| 4,672,221 | 6/1987 | Saito et al. | 257/435 |
| 4,740,824 | 4/1988 | Yano et al. | 250/208.1 |
| 4,943,839 | 7/1990 | Kumano et al. | 250/578.1 |

FOREIGN PATENT DOCUMENTS

61-82570  4/1986  Japan.

Primary Examiner—David C. Nelms
Assistant Examiner—Que T. Le
Attorney, Agent, or Firm—Oliff & Berridge

[57] ABSTRACT

A high density image sensor capable of higher resolution reading is realized by laminating layers on the photodiodes of the image sensor to allow additional capacitors to form therein in a vertically overlapping relation with the photodiodes. Each photodiode is formed on a substrate and includes a lower electrode, a photoelectric conversion layer, and a transparent electrode. The capacitors form where a transparent insulating layer and a transparent conductive layer are sequentially formed on the transparent electrode of the photodiode. The photodiode and the capacitors are electrically connected in parallel. The capacitors, one of which is outside the photodiode, do not enlarge the photodiode or affect the photo-/dark current ratio of the image sensor, thus enhancing the density of the image sensor and its resolution.

13 Claims, 7 Drawing Sheets

MULTI-CAPACITANCE PHOTODIODE IMAGE SENSOR

FIELD OF THE INVENTION

This invention relates to an image sensor used in facsimile machines, image scanners, or the like, and more particularly to an image sensor capable of higher resolution reading with a higher photo-/dark current ratio, and to an image reading apparatus incorporating the image sensor.

BACKGROUND OF THE INVENTION

A conventional facsimile machines or the like uses an image sensor as an optical reader of original images. The image sensor generally includes a plurality of photodiodes aligned along the width of the original, each of the photodiodes having a semiconductor layer of an amorphous material or the like interposed between a pair of electrodes.

Figure 10:
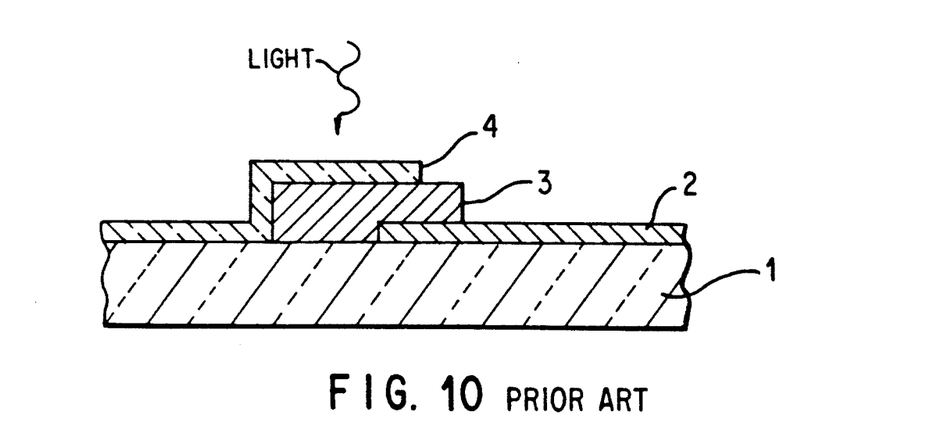
FIG. 10 is a cross-sectional view of a photoreceptor element of a conventional image sensor.

The conventional image sensor is illustrated in FIG. 10 in a cross-sectional view, and has a laminated configuration including an insulating substrate 1 of, for example, glass or ceramics, a lower electrode 2 of chromium (Cr), a semiconductor photoelectric conversion layer 3 of amorphous silicon hydride or the like, and a transparent electrode 4 of indium tin oxide. A light emitting device (not shown) emits light, which is reflected by the original document, etc. (not shown), passes through the rod lens array (not shown) such as SelFoc lens manufactured by Japan Sheet Glass Co. Ltd, and is finally focussed on the photoelectric conversion layer 3 through the transparent electrode 4.

The thus-configured image sensor usually uses as image information the electric charge generated by light incident on the photoelectric conversion layer 3, instead of using the photocurrents resulting from the light, since the light illuminating the photoelectric conversion layer 3 is approximately 100 lux in the usual optical mechanism mentioned above. Light of this intensity generates photocurrents of approximately 1 nA, which are too small to detect. The image sensor therefore is usually operated using a charge-reading method, in which the electric charge generated in the photoelectric conversion layer 3 is stored in a first storage element such as a capacitor. The stored charge is then transferred, using switching elements such as thin-film transistors, to a second storage element, such as a capacitor, then read out as an electric signal.

Figure 11:
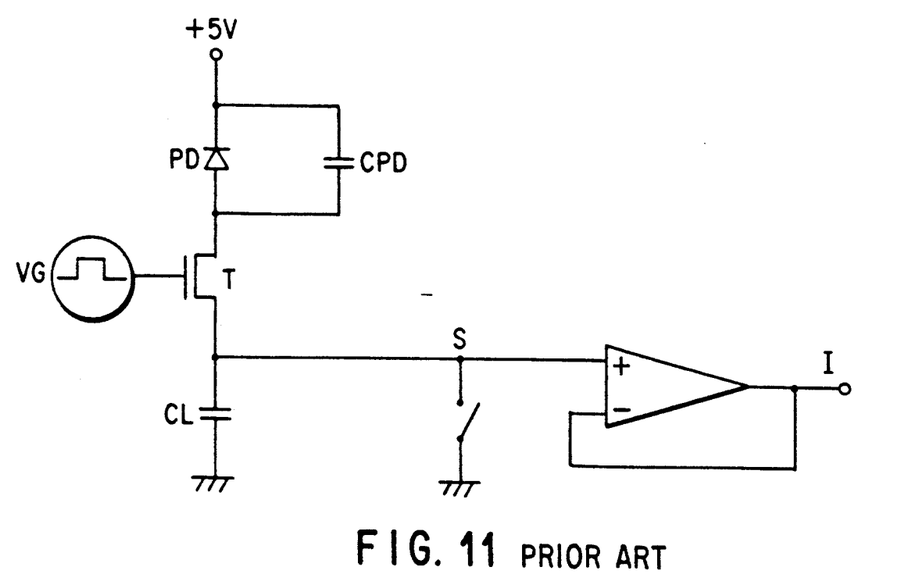
FIG. 11 is an equivalent circuit diagram of the portion of the conventional image sensor corresponding to one picture element.

This charge-reading method will be now described in detail with reference to FIG. 11, which shows an equivalent circuit diagram of a portion of the conventional image sensor corresponding to one picture element. Each photoreceptor element, which corresponds to one picture element, may be regarded as equivalent to a photodiode PD and a series-connected capacitor CPD. In operation, the photodiode PD is first reverse-biased at +5 V, and then illuminated to cause a photocurrent flow in the photoelectric conversion layer, which is stored as an electric charge in the capacitor CPD. In response to the energization of an associated field effect transistor T, the stored charge is transferred to a floating capacitor CL in an associated wiring conductor at the bottom of the figure. An external amplifier 1 then amplifies the transferred charge and outputs an electric signal. After the electric signal is output, a resetting analog switch S resets the circuit.

The above image sensor suffers from the following problems. The capacitance of capacitor CPD of the image sensor is relatively small and generally insufficient. This limited capacitance deteriorates the linearity of the proportional relationship between the exposure (=illumination intensity×time) and the output voltage of the image sensor. Insufficient capacitance coincident with poor photo-/dark current ratio cause poor gradation in the electric signal.

In Japanese Patent Laid Open No. SHO. 61-82570 (1986), an image sensor is disclosed which has the capacitance of its capacitor increased by extending the photoelectric conversion layer in the slow scan direction so as to enlarge the portion of the photoelectric conversion layer interposed between the lower electrode and the upper electrode. The photoreceptive area of the image sensor is limited by shielding.

Figure 12:
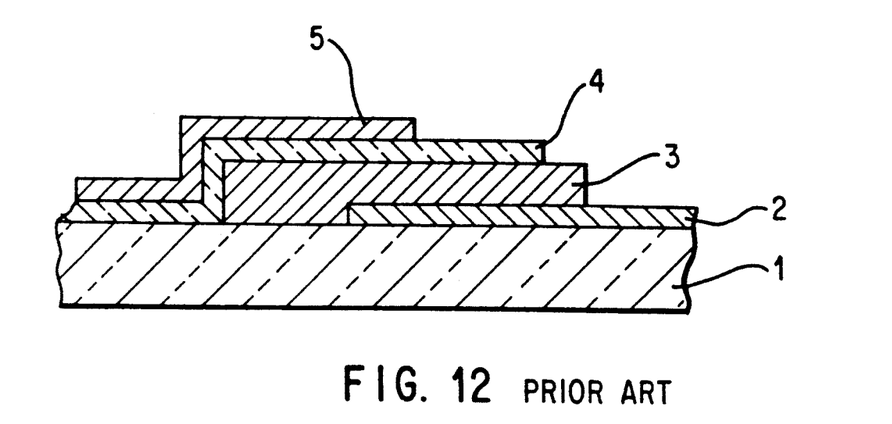
FIG. 12 is a cross-sectional view of a photoreceptor element of another conventional image sensor, of a type having an increased capacitance.
Figure 13:
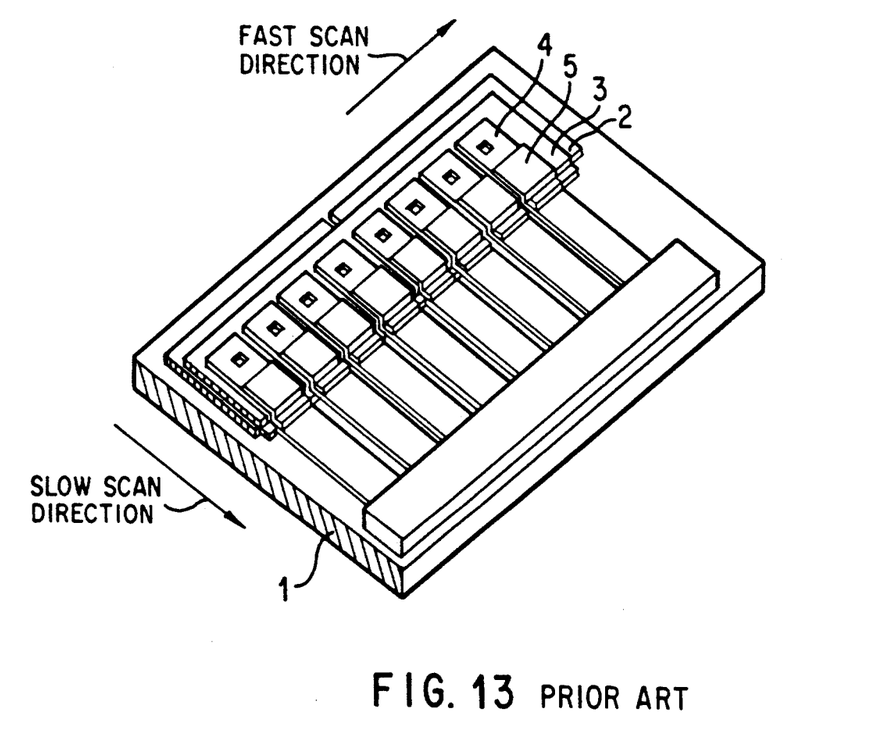
FIG. 13 is a perspective view of the image sensor shown in FIG. 12.

This image sensor, which is illustrated in FIG. 12 in cross-sectional view and in FIG. 13 in perspective view, includes a plurality of photoreceptor elements aligned on a substrate 1 in the fast scan direction. The respective electrodes 5 of the photoreceptor elements extend in the slow scan direction from the tops of the photoreceptor elements to a shift register to introduce the electric charge generated in the photoreceptor elements to the shift register.

Each of the photoreceptor elements has a laminated configuration, including an insulating substrate 1, a lower electrode 2 as a common electrode and formed of chromium (Cr), a photoelectric conversion layer 3 of amorphous silicon hydride or the like extending in the slow scan direction such that a relatively wide portion of the photoelectric conversion layer 3 overlaps with the lower electrode 2, a transparent electrode 4 of indium tin oxide formed over the photoelectric conversion layer 3, and an extracting electrode 5 of chromium partially covering the transparent electrode 4 so as to define the photoreceptive area.

Figure 14:
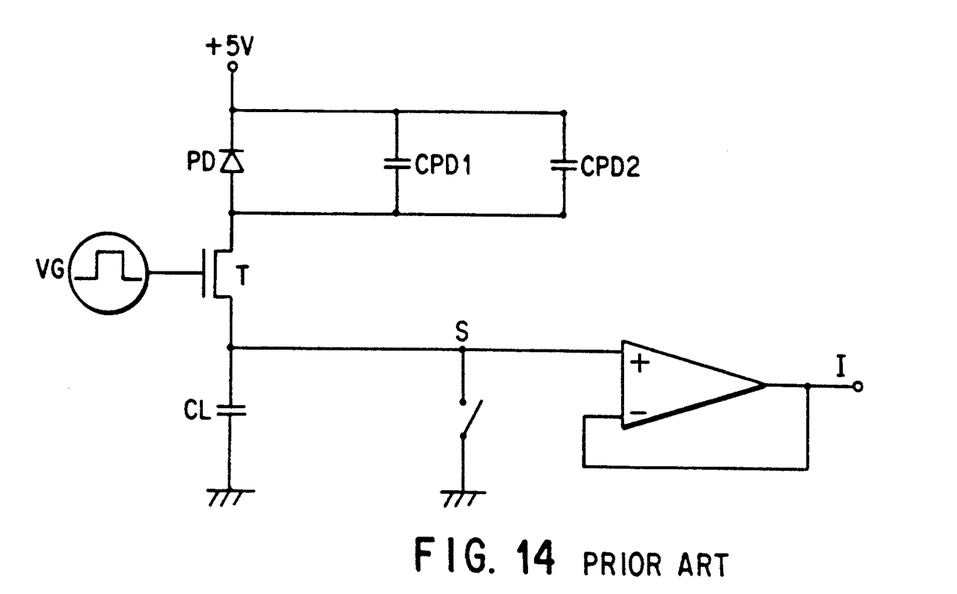
FIG. 14 is an equivalent circuit diagram of the image sensor shown in FIG. 12 corresponding to one picture element.

The above configuration creates two capacitors CPD1 and CPD2. Capacitor CPD1 is formed by the lower electrode 2 and the transparent electrode 4, and CPD2 is formed by the lower electrode 2 and the extracting electrode 5, as shown in FIG. 14 of an equivalent circuit diagram of the photoreceptor element. The photoreceptor element having capacitors with increased capacitance can store more electric charge, improving the linearity of the proportional relationship between the exposure and the output voltage of the image sensor.

However, this conventional image sensor shown in FIGS. 12, 13 and 14 has a relatively poor photo-/dark current ratio. By enlarging the photoelectric conversion layer 3 to increase the capacitance of the capacitors, the dark currents in the photoelectric conversion layer 3 are increased, resulting in a lower photo-/dark current ratio.

SUMMARY OF THE INVENTION

The present invention provides an image sensor with capacitors having sufficient charge-storing capacitance without also lowering the photo-/dark current ratio of the image sensor, overcoming the above-mentioned conventional problems. The present invention further provides an image reading apparatus capable of higher resolution reading, which incorporates the above image sensor.

An image sensor according to the present invention comprises a photodiode and a capacitor; both electrically connected in parallel to each other, and physically overlapping in the vertical direction. The photodiode is formed on a substrate and includes a first electrode, a photoelectric conversion layer, and a second electrode. The capacitor forms where an insulating layer and a third electrode are sequentially disposed next to the photodiode in the vertical direction. The third electrode is kept at a fixed potential, forming a capacitor having a stable capacitance between the third electrode and the photodiode. Placing the capacitor outside the photodiode allows the image sensor to have a greater charge-storing capacity without resorting to enlarging the photodiode, thus avoiding any deterioration in the photo-/dark current ratio.

An image reading apparatus according to the present invention comprises an image sensor according to the present invention, a transfer means for transferring an electric charge, stored in a photodiode and a capacitor of the image sensor, to a line capacitor of an associated signal line, and an output means for providing the voltage value of the transferred charge as its output.

DETAILED DESCRIPTION OF THE PREFERRED EMBODIMENTS

Figure 1:
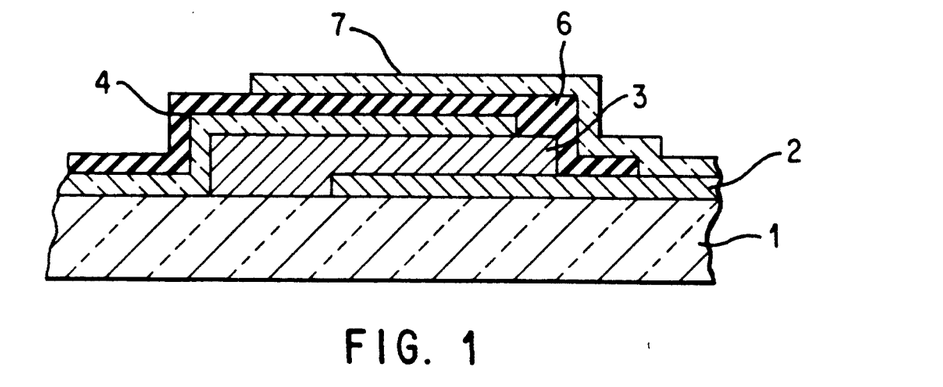
FIG. 1 is a cross-sectional view of a photoreceptor element of a first embodiment of an image sensor according to the present invention.

A first embodiment of an image sensor according to the present invention will be described with reference to FIG. 1, which shows a cross-sectional view of a photoreceptor element of the image sensor of a first embodiment. In FIG. 1, the same reference numerals as in FIG. 10 are used to identify like parts.

The image sensor has a plurality of photoreceptor elements 100 of a laminated configuration, each of the photoreceptor elements 100 comprising an insulating substrate 1 of glass, ceramics, or the like, a lower electrode 2 as a common electrode formed of chromium (Cr) and formed on the substrate 1, a photoelectric conversion layer 3 of amorphous silicon hydride, a transparent electrode 4 of, for example, indium tin oxide, a transparent insulating layer 6, and a transparent conductive layer 7 formed on the top of the lamination.

Figure 2:
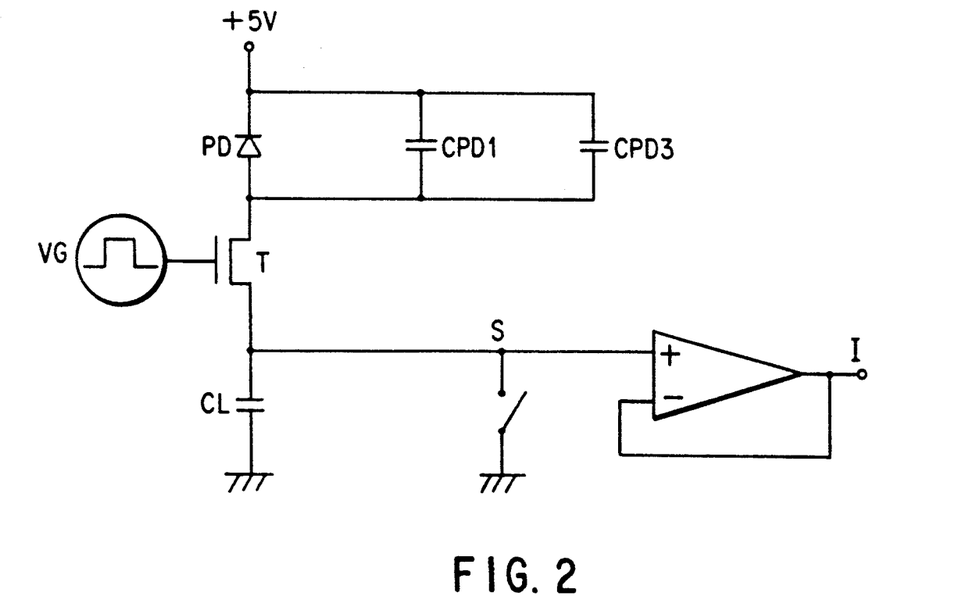
FIG. 2 is an equivalent circuit diagram of the portion of the image sensor corresponding to one picture element of the first embodiment.

This photoreceptor element 100 has a capacitor CPD1 formed by the lower electrode 2 and the transparent electrode 4, and a capacitor CPD3 formed by the transparent electrode 4 and the transparent conductive layer 7, as can be seen in its equivalent circuit diagram as shown in FIG. 2. These two capacitors physically overlap in the vertical direction, and both are electrically connected in parallel with the photodiode PD. The lower electrode 2 and the transparent conductor layer (or third conducting layer) 7 are kept at the same potential since they are connected at an end of the photoreceptor element as shown in the right end of FIG. 1.

With this configuration, the image sensor has the following advantages. First, the vertically overlapping capacitors CPD1 and CPD3 enhance the total capacitance of the photoreceptor element, with no need to enlarge the photoreceptor element. With an increased capacitance, the photoreceptor element can store more electric charge, which results in a more linear proportional relationship between the exposure and the output voltage. Secondly, the intermediate layer in the capacitor CPD3 between the transparent electrode 4 and the transparent conductor 7 is not a photoelectric conversion layer but the transparent insulating layer 6 which neither is affected by incident light nor increases dark currents. Accordingly, the image sensor of the first embodiment preserves a good photo-/dark current ratio.

Figure 6:
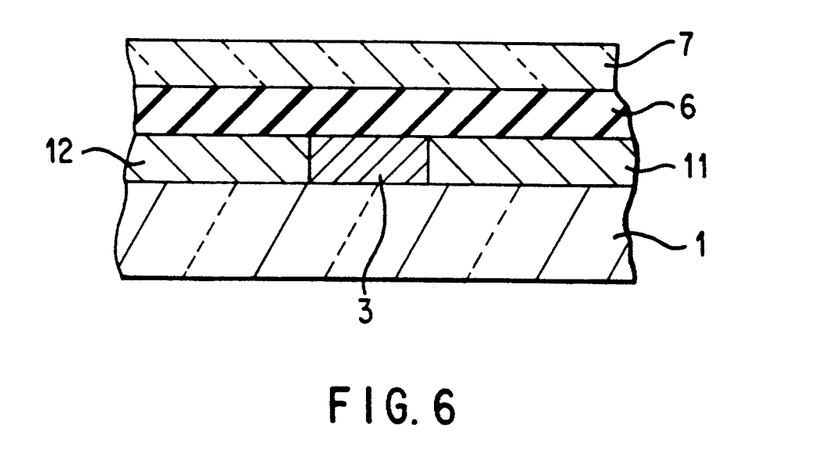
FIG. 6 is a cross-sectional view of a photoreceptor element of an variation of the first embodiment.

A first variation of the first embodiment of the image sensor, which is shown in FIG. 6, comprises the substrate 1, the photoelectric conversion layer 3 formed on the substrate 1, electrodes 11 and 12 formed of, for example, metal and formed on the substrate and sandwiching the photoelectric conversion layer 3 in the transverse direction, the transparent insulating layer 6 formed thereon, and the transparent conductor 7 covering the resultant substrate. This variation exhibits the equivalent characteristics to those of the first embodiment.

Figure 7:
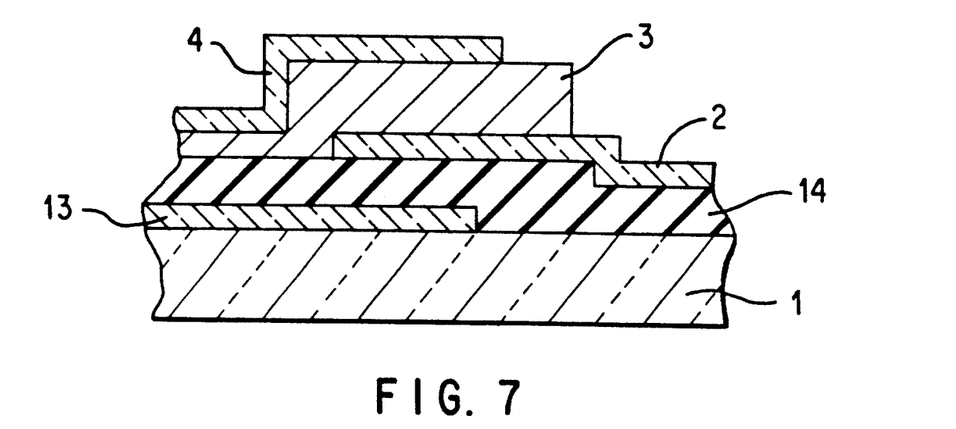
FIG. 7 is a cross-sectional view of a photoreceptor element of another variation of the first embodiment.

A second variation of the first embodiment of the image sensor is shown in cross-section in FIG. 7, in which a conductive layer 13 and an insulating layer 14 are formed between the substrate 1 and the lower electrode 2. The conductive layer 13 is formed of chromium (for a metal electrode), indium tin oxide (for a transparent electrode), or the like. The insulating layer 14 is formed of silicon nitride or the like. The second capacitor CPD3 of this image sensor is formed under the photodiode by the lower electrode 2 and the conductive layer 13. The transparent electrode 4 and the conductive layer 13 are kept at the same potential by connecting each other at the output end.

Figure 8:
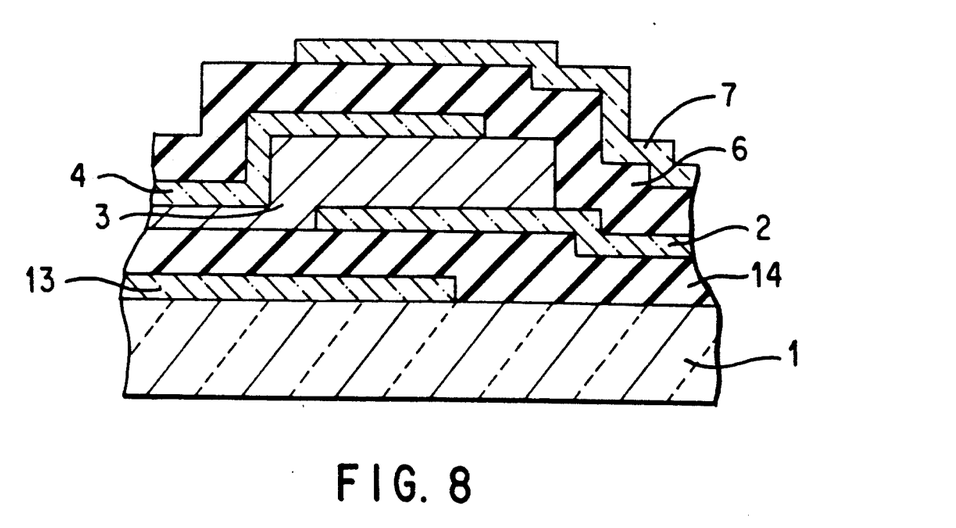
FIG. 8 is a cross-sectional view of a photoreceptor element of yet another variation of the first embodiment.
Figure 9:
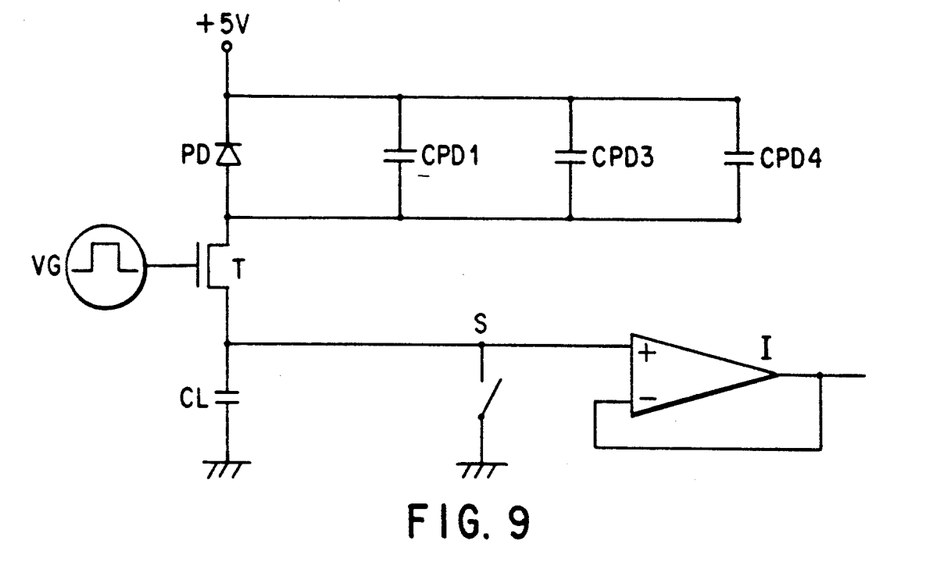
FIG. 9 is an equivalent circuit diagram of the portion of the image sensor shown in FIG. 7 corresponding to one picture element.

A third variation of the first embodiment of the image sensor is shown in cross-section in FIG. 8. This third variation is based on the image sensor shown in FIG. 7 and further comprises the transparent insulating layer 6 formed on the transparent electrode 4, and the transparent conductor layer 7. The transparent conductor layer 7 is connected to the lower electrode 2. This photoreceptor element therefore is provided with three capacitors CPD1, CPD3, and CPD4, as shown in its equivalent circuit diagram of FIG. 9. The capacitor CPD1 is formed by the lower electrode 2 and the transparent electrode 4, the capacitor CPD3 is formed by the transparent electrode 4 and the transparent conductor layer 7, and the capacitor CPD4 is formed by the lower electrode 2 and the conductive layer 13.

Figure 3:
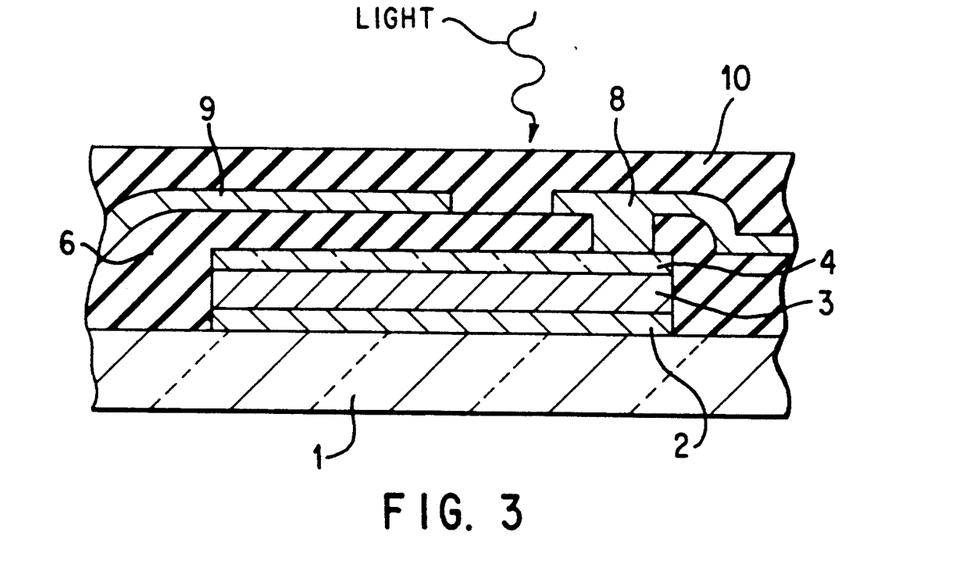
FIG. 3 is a cross-sectional view of a photoreceptor element of a second embodiment of an image sensor according to the present invention.
Figure 4:
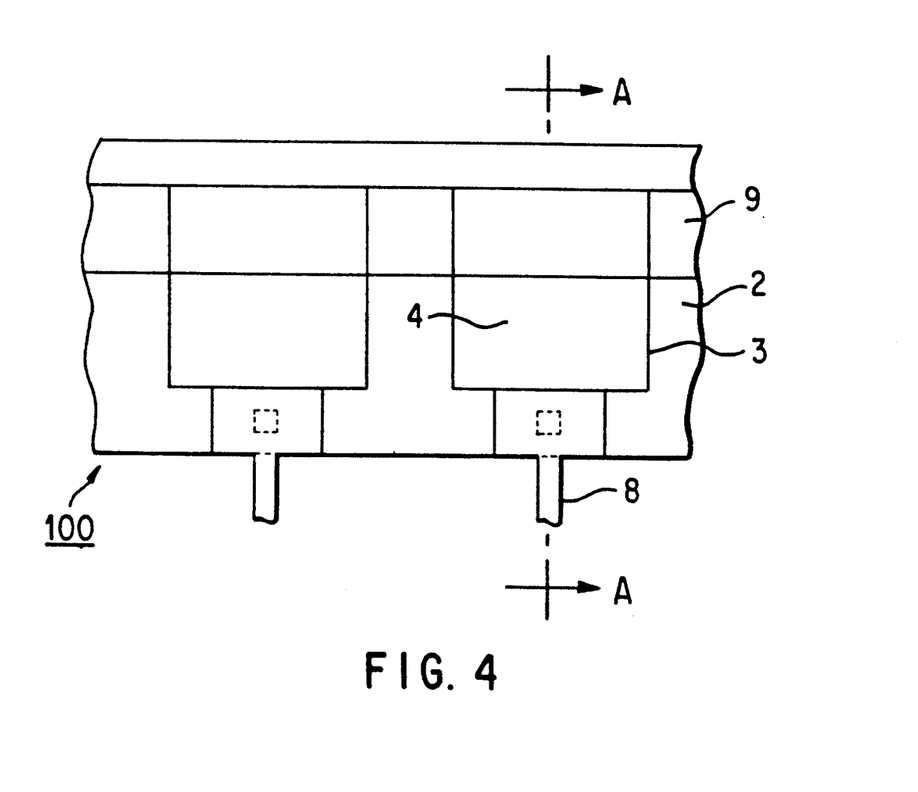
FIG. 4 is a plan view of the image sensor of the second embodiment.
Figure 5:
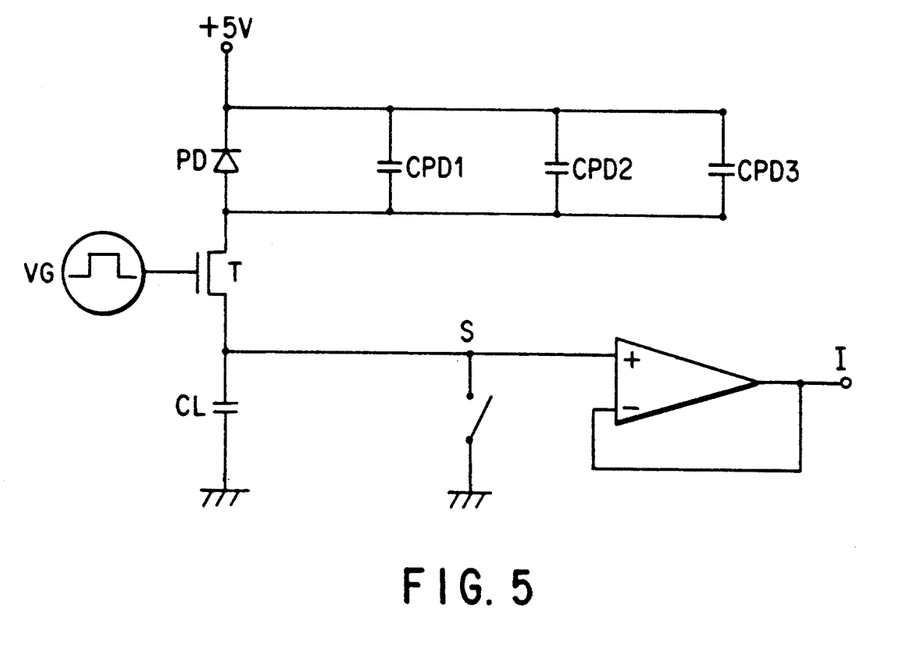
FIG. 5 is an equivalent circuit diagram of the image sensor corresponding to one picture element of the second embodiment.

A second embodiment of an image sensor according to the present invention will be next described using FIGS. 3, 4, and 5. FIG. 3 is a cross-section of the photoreceptor element of the second embodiment of the image sensor, taken along like 3—3 in FIG. 4. FIG. 4 is a plan view of the photoreceptor elements aligned one-dimensionally.

The photoreceptor element of the second embodiment, as shown in FIG. 3, comprises the substrate 1, the lower electrode 2 formed of, for example, chromium and formed on the substrate 1, the photoelectric conversion layer 3 of amorphous silicon hydride, the transparent electrode 4 of indium tin oxide, the transparent insulating layer 6 of polyimide covering the entire substrate, an opening 6a formed in the transparent insulating layer 6, a wiring conductor 8 of aluminum (Al) connected to the transparent electrode 4 through the opening 6a, a light-shielding conductive layer 9 to define the photoreceptive area, and a protecting film 10 covering the entire resultant substrate.

The lower electrode 2 extends in a strip shape in the fast scan direction (in the right-to-left direction in FIG. 4) to serve as a common electrode, and is biased at a constant potential. The photoelectric conversion layer 3 as well as the transparent electrode 4 are segmented and spaced apart in the fast scan direction, as shown in FIG. 4. In order to increase the picture element density, the second embodiment employs the light-shielding conductive layer 9 to define the photoreceptive area of the photoreceptor element which is enlarged in the slow scan direction. The light-shielding conductive layer 9 and the lower electrode 2 are connected to each other at an end of the photoreceptor element array in the fast scan direction or in the slow scan direction.

FIG. 5 shows an equivalent circuit diagram of the photoreceptor element corresponding to one picture element of the second embodiment of the image sensor shown in FIG. 3. The photoreceptor element includes a photodiode PD reverse-biased at +5 V, and three capacitors CPD1, CPD2, and CPD3 connected in parallel with the photodiode PD. The capacitor CPD1 is formed in the photoreceptive area by the lower electrode 2 and the transparent electrode 4, the capacitor CPD2 is formed outside the photoreceptive area by the lower electrode 2 and the transparent electrode 4, and the capacitor CPD3 is formed by the transparent insulating layer 6, where it is interposed between the transparent electrode 4, and the light-shielding conductive layer 9.

The second embodiment of the image sensor with the three capacitors therefore has an increased capacitance, resulting in better linearity compared with that of the conventional image sensor shown in FIG. 10. In addition, the second embodiment achieves a higher photo-/dark current ratio compared with that of the conventional image sensor shown in FIG. 12, since the capacitor CPD3 is located where its presence does not increase the dark current.

A method of fabricating the photoreceptor element of the second embodiment of the image sensor will be described.

First, chromium is deposited to a thickness of approximately 150 nm on the insulating substrate 1 by DC magnetron spattering, and patterned by photolithography to form the strip-shaped lower electrode 2 as a common electrode extending in the fast scan direction (in the right-to-left direction of FIG. 4). A semiconductor layer of amorphous silicon hydride is deposited thereon to a thickness of approximately 1,300 nm by plasma CVD (chemical vapor deposition), and indium tin oxide is deposited thereon to a thickness of approximately 60 nm by DC magnetron spattering. The indium tin oxide layer 4 is then patterned by photolithography to yield the transparent electrode 4 serving as an individual electrode segmented for each picture element. Utilizing the resist remaining on the transparent electrode 4 as a mask, the semiconductor layer is patterned to form the photoelectric conversion layer 3 identical to the transparent electrode 4 in shape. The transparent insulating layer 6 of polyimide is next deposited to a thickness of 1300 nm, and subjected to photolithographic patterning to form the opening 6a in the transparent insulating layer 6. Aluminium is then deposited to a thickness of approximately 1,000 nm on the transparent insulating layer 6 by DC magnetron spattering, and patterned to yield the wiring conductor 8 and the light-shielding conductive layer 9. The light-shielding conductive layer 9 is connected to the lower electrode 2 at an end of the photoreceptor element arrays in the fast scan direction or in the slow scan direction, so that the light-shielding conductive layer 9 and the lower electrode 2 are kept at the same potential. Finally, polyimide is coated on the top of the resulting substrate to a thickness of approximately 3 m, and patterned to form the protecting film 10 by photolithography followed by etching.

The above materials used for the members of the photoreceptor element can be replaced with other preferable materials. For example, insulating and heat-resistive substrates of glass, ceramic or the like are acceptable for the substrate 1. The lower electrode 2 may use a metallic material such as molybdenum (Mo) or titanium (Ti), or a conductive high molecular compound in place of chromium (Cr). The photoelectric conversion layer may use a semiconductor thin film such as cadmium selenide instead of amorphous silicon hydride. The transparent insulating layer 6 may use silicon hydride or silicon nitride in place of polyimide. The light-shielding conductive layer 9 may use a metallic thin film such as chromium instead of aluminum.

The second embodiment of the image sensor operates as follows. Light reflected from the original document, etc. is incident on the photodiode PD with the field effect transistor T remaining open (i.e., in an "off" state), causing the photogenerated charge to be stored in the capacitors CPD1, CPD2, and CPD3 during a time spent for one line scanning. A gate signal pulse VG is transmitted to the field effect transistor T, to cause it to close (i.e. switch to an "on" state). The capacitors CPD1, CPD2, and CPD3 are thereby connected to a line capacitor CL, and the charge stored in the capacitors CPD1, CPD2, and CPD3 is transferred to the line capacitor CL (through the transistor (or transfer means) T. The charged voltage of the line capacitor CL is then amplified (or output means) by an exterior amplifier I to the level readable as an image signal. After obtaining all the image signals for one scan line by repeating this series of operations, the signal line is reset by a resetting analog switch S to be ready for the next line image reading.

An image reading apparatus, which incorporates an image sensor with the same basic mechanism as the first or the second embodiment, and is provided with a field effect transistor T as a switching element for charge transfer and an amplifier I, achieves a higher resolution without lowering the photo-/dark current ratio.

The first embodiment and the second embodiment of the image sensor can be applied to a two-dimensional image sensor, by arranging the photoreceptor elements two-dimensionally. A two-dimensional image sensor using the same basic mechanism as the second embodiment achieves a higher resolution without lowering photo-/dark current ratio.

The invention has been described with reference to the preferred embodiments thereof, which are illustrative and not limiting. Various changes may be made without departing from the spirit and scope of the invention as defined in the appended claims.

What is claimed is:

1. An image sensor comprising:
   a substrate;
   a first conducting layer formed on the substrate;
   a photodiode formed on the substrate and the first conducting layer;
   a second conducting layer formed on the substrate and the photodiode layer so as to overlap the first conducting layer, thereby forming a first capacitor;
   an insulating layer formed on the substrate, the first conducting layer, the photodiode layer and the second conducting layer; and
   a third conducting layer formed on the insulating layer so as to overlap at least one of the first and second conducting layers, thereby forming a second capacitor, wherein the first capacitor, the second capacitor and the photodiode layer are connected in parallel.

2. The image sensor of claim 1, wherein the third conducting layer overlaps the second conducting layer to form the second capacitor.

3. An image sensor according to claim 1, wherein said third conducting layer is made of a transparent material.

4. An image sensor according to claim 1, wherein said third conducting layer is made of a light-shielding material and partially overlaps the top of said photodiode to define a photoreceptive area of said photodiode.

5. An image sensor according to claim 1, wherein said third conducting layer is kept at a fixed potential.

6. An image sensor comprising:
   a substrate;
   a first conducting electrode formed on said substrate;
   a photoelectric conversion layer formed on said substrate adjacent to said first electrode;
   a second conducting electrode formed on said substrate adjacent to said photoelectric conversion layer, such that said photoelectric conversion layer is interposed between said first electrode and said second electrode;
   an insulating layer formed on the first and second conducting electrodes and the photoelectric conversion layer; and
   a third conducting electrode formed over the insulating layer and overlapping the first and second conducting electrodes so as to form a first capacitor with one of the first conducting electrode and second conducting electode and a second capacitor with the other of the first and second conducting electrodes.

7. An image sensor comprising:
   a substrate;
   a first conducting layer formed on the substrate;
   a first insulating layer formed on the substrate and the first conducting layer;
   a second conducting layer formed on the first insulating layer so as to overlap the first conducting layer, thereby forming a first capacitor;
   a photodiode layer formed over the second conducting layer and the first insulating layer; and
   a third conducting layer formed on the photodiode layer so as to overlap at least one of the first and second conducting layers, thereby forming a second capacitor.

8. The image sensor of claim 7, wherein the third conducting layer overlaps the second conducting layer to form the second capacitor.

9. An image sensor according to claim 7, comprising:
   a second insulating layer formed on the photodiode layer and the third conducting layer; and
   a fourth conducting layer formed on the second insulating layer so as to overlap at least one of the first, second and third conducting layer, thereby forming a third capacitor.

10. The image sensor of claim 9, wherein the fourth conducting layer overlaps the third conducting layer to form the third capacitor.

11. An image sensor comprising:
    a substrate;
    a laminate layer formed on the substrate having a first conducting layer, a photodiode layer formed on the first conducting layer and a second conducting layer formed on the photoconductive layer, the laminate layer forming a first capacitor;
    a first insulating layer formed on the substrate and the laminate layer;
    a via to the second conducting layer, the via formed in the first insulating layer;
    a third conductive layer formed on a first portion of the first insulating layer and the via, overlapping the laminate layer and electrically connecting to the second conductive layer, and overlapping the first conductive layer so as to form a second capacitor with the laminate layer;
    a light-shielding conducting layer formed on a second portion of the first insulating layer, spaced from the third conducting layer and overlapping the laminate layer, so as to form a third capacitor with the laminate layer.

12. The image sensor of claim 11, further comprising a protecting film formed over the first insulating layer, the third conducting layer and the light-shielding conducting layer.

13. An image reading apparatus comprising:
    a substrate;
    a first conducting layer formed on the substrate;
    a photodiode formed on the substrate and the first conducting layer;
    a second conducting layer formed on the substrate and the photodiode layer so as to overlap the first conducting layer, thereby forming a first capacitor;

an insulating layer formed on the substrate, the first conducting layer, the photodiode layer and the second conducting layer;

a third conducting layer formed on the insulating layer so as to overlap at least one of the first and second conducting layers, thereby forming a second capacitor, wherein the first capacitor, the second capacitor and the photodiode layer are connected in parallel;

a transfer means for transferring electric charge stored in said photodiode and said first and second capacitors to a line capacitor of an associated signal line; and an output means for outputting the voltage value of the transferred charge as image data.

* * * * *